United States Patent
Klette

(10) Patent No.: US 6,698,086 B1
(45) Date of Patent: Mar. 2, 2004

(54) METHOD FOR THE LINEAR CONFIGURATION OF METALLIC FUSE SECTIONS ON WAFERS

(75) Inventor: Rüdiger Klette, Kornwestheim (DE)

(73) Assignee: Infineon Technologies AG, Munich (DE)

( * ) Notice: Subject to any disclaimer, the term of this patent is extended or adjusted under 35 U.S.C. 154(b) by 727 days.

(21) Appl. No.: 09/163,874

(22) Filed: Sep. 30, 1998

(30) Foreign Application Priority Data

Sep. 30, 1997 (DE) .......................... 197 43 271

(51) Int. Cl.⁷ .................. H01H 69/02; H01H 85/20
(52) U.S. Cl. ................. 29/623; 29/825; 337/297; 337/198; 337/160
(58) Field of Search ............... 29/610.1, 611, 29/620, 623, 825; 337/159, 198, 160, 296, 297; 365/225.7, 96

(56) References Cited

U.S. PATENT DOCUMENTS 4,536,949 A     8/1985   Takayama et al.
4,647,906 A  *  3/1987   Naylor et al. .............. 340/347
4,703,389 A    10/1987   Scott
4,894,791 A     1/1990   Jiang et al.
4,985,866 A  *  1/1991   Nakaizumi ................. 365/200

FOREIGN PATENT DOCUMENTS

DE   195 48 984 A1    7/1996
EP   0 327 078 A2     8/1989
GB   2177562     *    1/1987
GB   2177562     *    1/1997

* cited by examiner

Primary Examiner—Peter Vo
Assistant Examiner—Minh Trinh
(74) Attorney, Agent, or Firm—Laurence A. Greenberg; Werner H. Stemer; Ralph E. Locher

(57) ABSTRACT

Linear configurations of metallic fuse sections have a bit combination which represents a characteristic of a circuit on a wafer. The metallic fuse sections need to be rid of a polyimide layer covering them in order to make it possible to burn the fuse sections. In the event of unsatisfactory adherence to process parameters and insufficient removal of polyimide on the metallic fuse sections, a resulting relative error in a characteristic of the circuit is minimized according to the method since the fuse section corresponding to the most significant bit is neighbored on both sides by other fuse sections.

4 Claims, 2 Drawing Sheets

METHOD FOR THE LINEAR CONFIGURATION OF METALLIC FUSE SECTIONS ON WAFERS

BACKGROUND OF THE INVENTION

Field of the Invention

The invention relates to a method for the linear configuration of metallic fuse sections, which have a bit combination that represents a characteristic of a circuit on a wafer.

The setting of circuit characteristics, for example delay times and oscillator frequencies, is carried out on finished wafers by, inter alia, the burning of fuses. Metallic fuse sections which become severed upon burning, in that case are firstly buried under a polyimide passivation layer which is removed by exposure and subsequent etching above the fuses. It is only after the polyimide layer has been removed that it is possible to burn a fuse lying below it. Under optimum process conditions, the structuring of the polyimide layer takes place as desired, so that all of the fuse sections can be severed. However, under unfavorable conditions it may occur that the polyimide layer is not removed throughout the desired region. Fuse sections which are then still buried under polyimide cannot be burnt, i.e. severed. Since the status of a bit is dictated by the state of a fuse section, i.e. whether or not it has been severed, and the bits form the characteristic by that combination, deviations may occur between the value communicated to the circuit by burning the fuses and the target value, that is to say the characteristic. In that case, the relative deviation of the characteristic depends, on one hand, on the number of affected fuse sections which it has not been possible through error to sever, and on the other hand on the significance of the bits which are assigned to those fuse sections. In that context, the significance of a bit is intended to mean the number which, if the bit is "1", contributes to the number to be formed in the scope of the bit combination. That will be illustrated with reference to the example of forming the number 21 by bit combination in the binary number system.

The relevant formula is:

$$number = \sum_{i=1}^{n} Bit_i \cdot 2^{i-1}$$

The significance of $Bit_i$ is thus $2^{i-1}$

For the number 21, this means:

$21 = Bit_1 \cdot 2^0 + Bit_2 \cdot 2^1 + Bit_3 \cdot 2^2 + Bit_4 \cdot 2^3 + Bit_5 \cdot 2^4 = 1 \cdot 2^0 + 0 \cdot 2^1 + 1 \cdot 2^2 + 0 \cdot 2^3 + 1 \cdot 2^4$ Thus, for example, the significance of $bit_5$ is $2^4 = 16$. When the number 21 is being formed by bit combination, $bit_5$ is to be taken as the most significant bit, and $bit_1$ is to be taken as the least significant bit.

SUMMARY OF THE INVENTION

It is accordingly an object of the invention to provide a method for the linear configuration of metallic fuse sections on wafers, which overcomes the hereinafore-mentioned disadvantages of the heretofore-known methods of this general type and in which the fuse sections, due to their bit combination, represent a characteristic of a circuit on a wafer, so that even in the event of unsatisfactory adherence to process parameters and insufficient removal of polyimide on the metallic fuse sections, a resulting relative error in the characteristic of the circuit is minimized.

With the foregoing and other objects in view there is provided, in accordance with the invention, a method for the linear configuration of metallic fuse sections having a bit combination representing a characteristic of a circuit on a wafer, which comprises providing a fuse section corresponding to the most significant bit; and placing other fuse sections adjacent both sides of the fuse section corresponding to the most significant bit.

The fuse section corresponding to the most significant bit is thus not located at one end of the linear configuration of metallic fuse sections. As studies have shown, when the process parameters are not adhered to satisfactorily, it is precisely at the ends of elongate regions, having surfaces which are to be rid of polyimide structures, that insufficient removal of the polyimide often occurs, for example as a result of rounding. However, with a configuration of the metallic fuse sections according to the invention, should the process parameters not be adhered to correctly and should insufficient polyimide removal take place, the fuse section which corresponds to the most significant bit will at first not be affected thereby. The fuse section corresponding to the most significant bit will not be compromised unless large deviations from the specified process parameters take place. It is thus possible to minimize the effects of unsatisfactory adherence to process parameters in a surprisingly simple way. In cases in which components could only be rejected with a conventional procedure, components are now obtained in which the circuit characteristics deviate minimally from the target value. On one hand, these components in many cases can still be sold, and on the other hand, in subsequent quality controls, conclusions may be drawn regarding insufficient polyimide removal on the basis of the particular characteristic deviations.

In accordance with another mode of the invention, the metallic fuse section corresponding to the most significant bit is located essentially in the middle of the linear configuration of the metallic fuse sections. Since the metallic fuse section which corresponds to the most significant bit and therefore makes the greatest contribution to forming the characteristic, is essentially located in the middle of the linear configuration, it is maximally removed from the ends of the elongate region which is rid of the polyimide applied to the wafer. With regard to photolithography, it is in particular the corner regions of structures which are to be rid of polyimide that are affected by deviations from the specified process parameters and the resulting reduction in polyimide ablation. Therefore, the middle of an elongate region must be regarded as particularly reliable in terms of full polyimide removal. Therefore, this configuration makes it particularly improbable that the most significant bit of the characteristic will be compromised due to errors in the polyimide structuring.

In accordance with a further mode of the invention, the fuse section corresponding to the least significant bit is located at one end of the linear configuration. Thus, if the polyimide removal is insufficient, it is firstly the fuse section which corresponds to the least significant bit, or the fuse section located at the other end of the linear configuration of fuse sections, that is affected thereby, which in the former case minimizes the relative deviation from the target value.

In accordance with a concomitant mode of the invention, the significance of the bits assigned to the metallic fuse sections decreases, from the metallic fuse section representing the most significant bit, in the direction of the two ends of the linear configuration of metallic fuse sections. This ensures that, should a fairly high degree of insufficient polyimide removal take place starting from the corner regions, the bits of the bit combination which are affected thereby are those which make a small contribution to the characteristic to be formed, due to their low significance.

Other features which are considered as characteristic for the invention are set forth in the appended claims.

Although the invention is illustrated and described herein as embodied in a method for the linear configuration of metallic fuse sections on wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
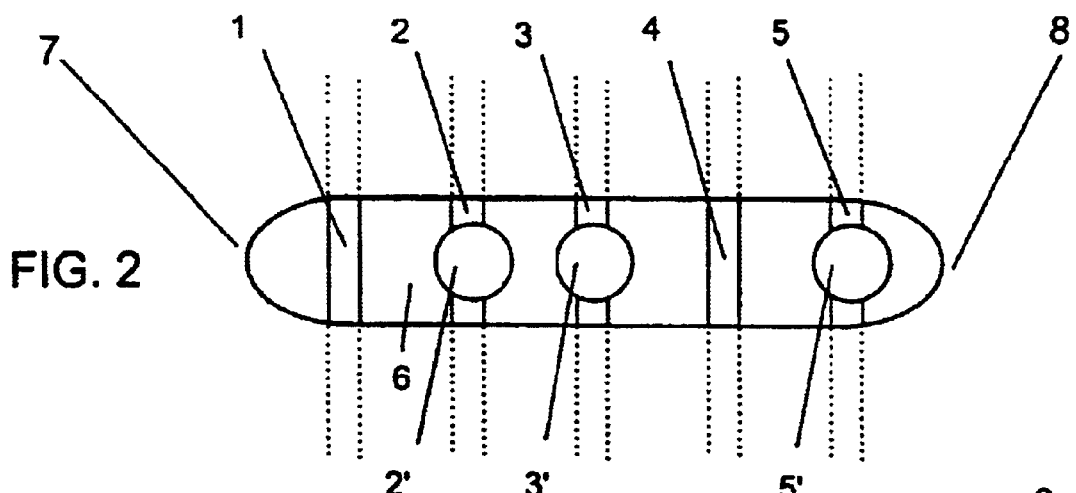
FIG. 2 is a diagrammatic plan view of a surface of a wafer, in which polyimide above a conventional configuration of fuses was removed without error, and fuses have already been burnt.
Figure 3:
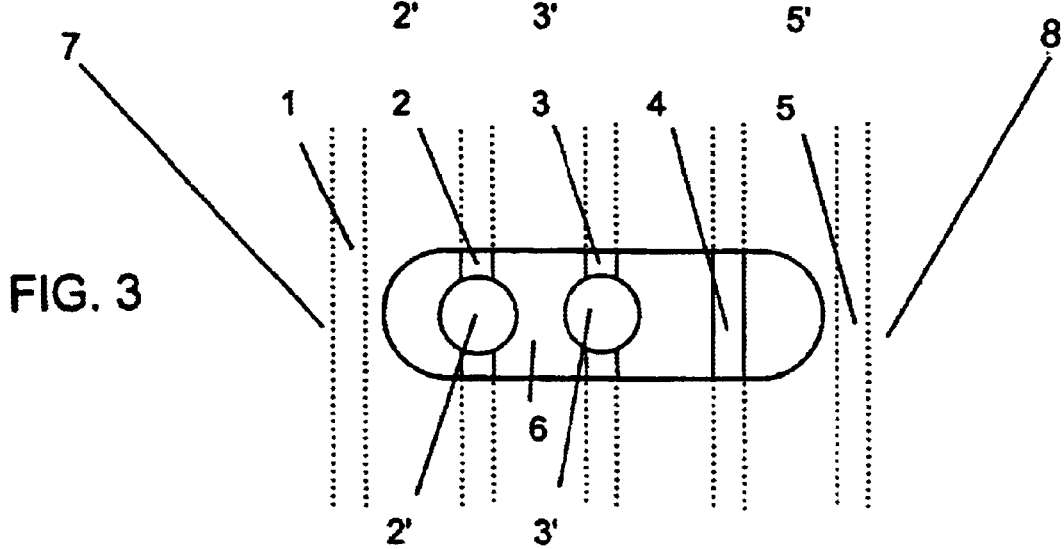
FIG. 3 is a plan view of a surface of a wafer, in which polyimide above a conventional configuration of fuses has not been removed without error, and fuses have already been burnt.
Figure 4:
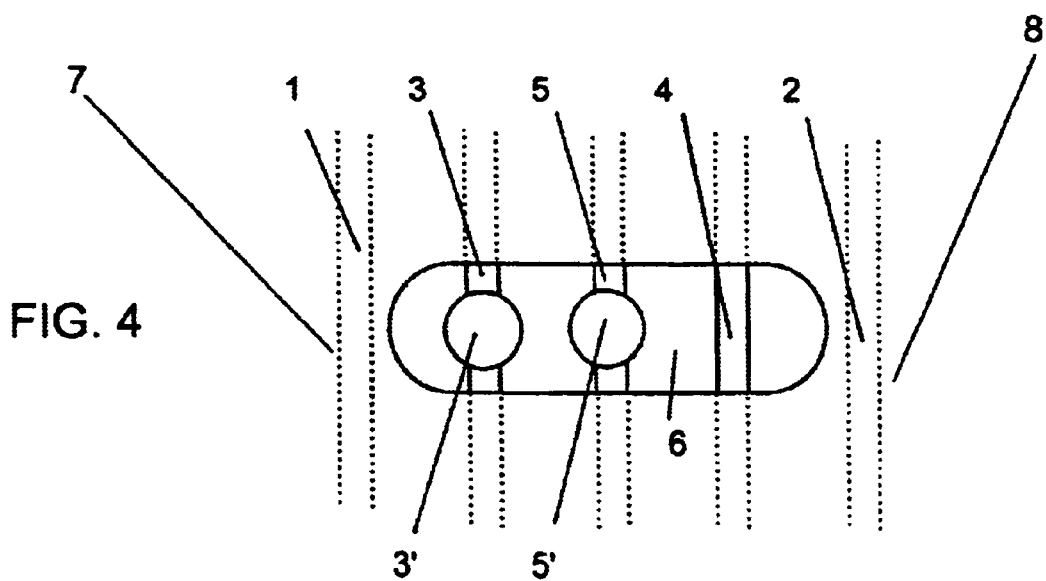
FIG. 4 is a plan view of a surface of a wafer according to FIG. 3, but in which the fuses are disposed according to the invention.

Referring now to the figures of the drawings in detail and first, particularly, to FIGS. 2–4 thereof, it is seen that fuses are provided with i =1, 2, 3, 4, 5 as reference numerals. An assigned significance is $2^{i-1}$ in each case.

Figure 1:
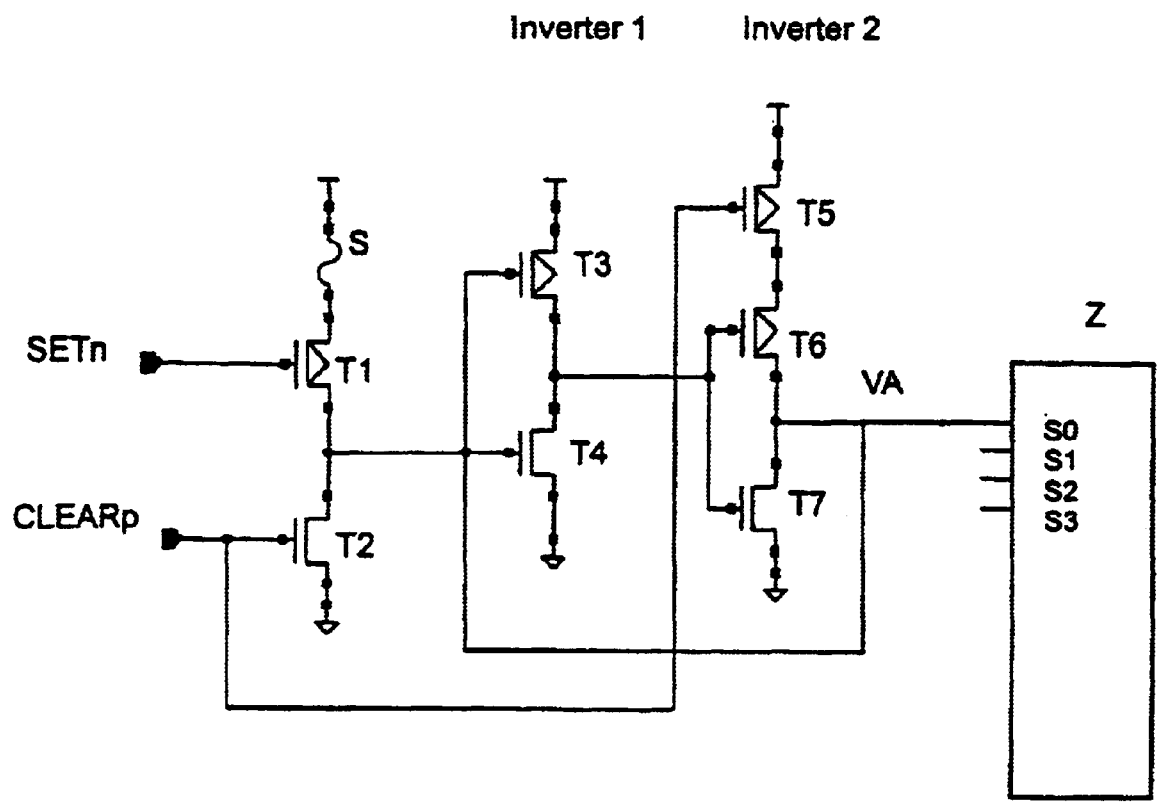
FIG. 1 is a schematic and block circuit diagram illustrating the use of a fuse in presetting a counter.

FIG. 1 represents a circuit-based use of a fuse S with reference to the example of presetting a counter. The counter is, for example, used to trim an oscillator which is disposed on a memory chip and determines an internal rate at which memory cells are refreshed. In a default state, a fuse circuit, which is formed of an input stage T1, T2 and two inverters 1 and 2 connected through feedback, is in the following state: transistors T3, T5 and T7 are on, and all other transistors are off. An output signal which presets the counter is set at logic "0". When a negatively active set pulse SETn is applied, the transistor T1 is turned on. When the fuse has not been burnt, the transistor T4 is therefore opened. At the same time, the transistor T3 is closed. As a consequence, in the inverter stage 2, the transistor 6 is opened, the transistor T7 is closed and logic "1" is therefore produced at an output VA, through the use of which an input S0 of a counter Z can be preset to "1". When the fuse has been severed, that is to say burnt, "0" is preset at the output VA, and the counter input is therefore also preset to "0", since the output potential does not change relative to the default state. The switching state of the two inverter stages is not affected by resetting the signal SETn due to the feedback of the two inverter stages. It is possible for the circuit to be reset to the default state at any time by application of a CLEARp pulse. It is therefore possible to preset all of the inputs S0, S1, S2, S3 . . . of a counter Z through the corresponding use of a plurality of fuses. Should a fuse not have been fully burnt, that results in an erroneous setting of the counter, the effect of which becomes more serious as the significance of the assigned bit increases.

FIG. 2 shows a region of a wafer, with linear ends 7 and 8, in which an elongate region 6 has been rid of polyimide material located on the surface. Fuses 2', 3', 5' have been burnt only in fuse sections 2, 3, 5. Fuse sections 1 and 4 are furthermore unsevered and therefore conductive. Regions of fuse sections which are buried under polyimide are represented by dotted lines.

FIG. 3 shows the same configuration, but in this case insufficient polyimide removal has taken place in corners in the region of the fuses 1 and 5, as may occur, for example, due to photolithography problems. The fuse sections 2, 3 are still severed. However, the fuse section 5 is below the polyimide layer and could not therefore be burnt, i.e. the fuse section 5 is still conductive. The fuse section 1 is also below the polyimide layer. However, since the fuse section 1 was not intended to be burnt, in this case this situation does not affect the calculation of the characteristic of the circuit. This characteristic is calculated as follows:

$$KG = C \cdot \sum_{i=1}^{n} Z(i) \cdot 2^{i-1}$$

$KG$ : characteristic $C$ : constant $i$ : running variable $n$ : number of fuses $Z(i)$ : state of the fuse $i$, the unburnt state being 1, and the state after burning being 0.

A characteristic of 22C is therefore calculated for the case represented in FIG. 2. In the case represented in FIG. 3, a characteristic of 6C is calculated. This pronounced difference is attributable to the fact that it has no longer been possible to sever the fuse section which corresponds to the most significant bit, that is to say the fuse section 5.

Since the target value of the characteristic is 22C, but the value calculable by a circuit on the wafer with the aid of the state of the fuses is 6C, the relative error is calculated at 73%.

A configuration of the fuse sections according to the invention is represented in FIG. 4. The fuse section S corresponding to the most significant bit is disposed in the middle and adjacent two other fuse sections 3, 4. The significance of the bits assigned to the metallic fuse sections 1–5 decreases from the metallic fuse section 5 representing the most significant bit to the metallic fuse sections 1, 2, in the direction toward both ends of the linear configuration of metallic fuse sections.

The insufficient polyimide removal as represented in FIG. 3 has been adopted in the case of FIG. 4. In this case again, it is not possible to sever, that is to say burn, the outer fuse sections, since they are below the polyimide layer. If the resulting characteristic is then calculated, a value of 20C is found. In just this simple example, with only five fuse sections, the relative error has thus been reduced from 73% to only 9% in comparison with a conventional configuration. As the value of the characteristic, and therefore also the number of fuse sections, increases, then the configuration according to the invention becomes even more advantageous in comparison with the conventional configuration, in which the significance assigned to the fuse sections increases from one end of the configuration to the other end.

I claim:

1. In a method for the linear configuration of metallic fuse sections, the improvement which comprises:

providing a fuse with fuse sections in a linear configuration, said fuse sections having a bit combination;

selecting a fuse section corresponding to the most significant bit; and placing other fuse sections adjacent both sides of the fuse section corresponding to the most significant bit.

2. The method according to claim 1, which comprises placing the metallic fuse section corresponding to the most significant bit substantially in the middle of the linear configuration of the metallic fuse sections.

3. The method according to claim 2, which comprises placing a fuse section corresponding to the least significant bit at one end of the linear configuration.

4. The method according to claim 1, which comprises placing the fuse section in order of decreasing significance of the bits assigned to the fuse sections, from the fuse section representing the most significant bit, in the direction of both ends of the linear configuration of fuse sections.

* * * * *